(12) United States Patent
Woodall et al.

(10) Patent No.: US 7,075,466 B1
(45) Date of Patent: Jul. 11, 2006

(54) SYSTEM AND METHOD FOR IMPROVING PERFORMANCE OF AN ANALOG TO DIGITAL CONVERTER

(75) Inventors: Neil Woodall, Newport Beach, CA (US); G. Finn Wredenhagen, Toronto (CA)

(73) Assignee: Pixelworks, Inc., Tualatin, OR (US)

(*) Notice: Subject to any disclaimer, the term of this patent is extended or adjusted under 35 U.S.C. 154(b) by 0 days.

(21) Appl. No.: 10/851,523

(22) Filed: May 20, 2004
(Under 37 CFR 1.47)

Related U.S. Application Data (60) Provisional application No. 60/472,311, filed on May 20, 2003.

(51) Int. Cl.
*H03M 1/20* (2006.01)

(52) U.S. Cl. ...................... 341/131; 341/143

(58) Field of Classification Search ............... 341/131, 341/144, 155, 126, 110, 143; 348/572, 574; 364/724.01
See application file for complete search history.

(56) References Cited

U.S. PATENT DOCUMENTS

| | | | | |
|---|---|---|---|---|
| 5,525,984 A | * | 6/1996 | Bunker | 341/131 |
| 5,710,729 A | * | 1/1998 | Feste et al. | 708/313 |
| 5,940,138 A | * | 8/1999 | Lowe | 348/574 |
| 6,173,003 B1 | * | 1/2001 | Whikehart et al. | 375/130 |
| 6,795,001 B1 | * | 9/2004 | Roza | 341/143 |
| 6,804,697 B1 | * | 10/2004 | Bugeja et al. | 708/805 |

\* cited by examiner

*Primary Examiner*—Rexford Barnie
*Assistant Examiner*—Joseph Lauture
(74) *Attorney, Agent, or Firm*—Marger Johnson & McCollom P. C.

(57) ABSTRACT

The present invention provides an ADC apparatus and method for improving effective bit resolution and suppressing digital reconstruction artifacts with an anti-aliasing filter and an over-sampled input. ADC resolution can be increased by combining a dither signal with a sampled signal and then after digitization, filtering out the dithered signal. Designing a notch in the filter corresponding to the attenuation frequency attenuates residual effects.

46 Claims, 5 Drawing Sheets

SYSTEM AND METHOD FOR IMPROVING PERFORMANCE OF AN ANALOG TO DIGITAL CONVERTER

1. PRIORITY INFORMATION

This application claims priority from U.S. Provisional Application No. 60/472,311, filed May 20, 2003, which we incorporate here by reference.

BACKGROUND

1. Field

The present invention relates generally to a system and method for improving the performance of an Analog to Digital Converter (ADC) and specifically for improving the accuracy of measurements sampled by the ADC.

2. Related Art

Traditionally, mathematical operations such as low-pass filtering have been performed on a band-limited analogue input signal in the analogue domain. But now, due to the tremendous increases in the speed of digital components, it is possible, and even advantageous, to perform many, if not all, mathematical operations in the digital domain where a greater degree of control and data manipulability can often be applied to the processed signal. The latter approach to processing relies on the application of analogue-to-digital conversion for interfacing between analogue and digital systems. Such conversion is applied by an Analogue-to-Digital Converter (ADC).

A continuous-time, or analogue, waveform that is sampled must be band-limited to avoid aliasing. Whittaker, Shannon, and Nyquist, derived a sampling bound for reconstructing a continuous-time signal from its constituent discrete-time, or digital, samples. In particular, the sampling frequency must be at least twice as great as the highest frequency component in the signal. Once the signal is appropriately band-limited, the signal is sampled and reconstruction is possible.

However, ADCs can be expensive and their pervasive use as necessary interface components in many systems can drive up the cost of the entire system, irrespective of the economies of scale. The cost of an ADC is typically a function of its sampling speed, internal characteristics that dictate fidelity, and the number of quantization levels. The quantization levels are typically representative of the word-length used to represent the sampled signal. Typically, when the ADC requires greater accuracy, it becomes more expensive to implement. Yet further, additional noise is introduced into the signal by a sampling clock of the ADC.

Thus, there is a need for an ADC that can achieve improved performance by improving the resolution and reducing the noise without the traditionally associated increase in cost. It is an object of the present invention to obviate and mitigate at least some of the above-mentioned disadvantages.

BRIEF DRAWINGS DESCRIPTION

Embodiments of the present invention will now be described by way of example only, with reference to the following drawings.

FIG. 6 is drawing illustrating two consecutive quantization levels and an input signal located there between.

DETAILED DESCRIPTION

For convenience, like numerals in the description refer to like structures in the drawings. The invention described herein provides a system and method that can be used to increase the effective bit resolution of an ADC as well as suppress digital reconstruction artifacts related to image manipulation processes.

Increased bit resolution is obtained by adding a perturbation signal, referred to as a dither signal, to a band-limited input signal during sampling. A rate at which the input signal is sampled is typically far greater than the band-limited frequency bound. The resulting perturbed signal is passed through an anti-aliasing filter to remove noise and increase the effective ADC bit resolution. At the same time, the anti-aliasing filter has a frequency characteristic is used for attenuating unwanted frequencies, such as those generated by the sampling clock of the ADC and certain sub-harmonic components.

The invention is discussed herein as being primarily related to artifact reduction wherever digital decoding is required, although it is not limited to this application. Applications of the invention include sampling analogue television signals, such as composite National Television Standards Committee (NTSC), Phase Alternation Line (PAL) and Sequential Couleur avec Memoire (SECAM), where the signals may have previously been subject to construction and deconstruction processes such as Moving Picture Experts Group (MPEG) compression. In addition, this method is advantageous wherever poor ADC characteristics corrupt the image by including unwanted periodic artifacts in the image.

Figure 1:
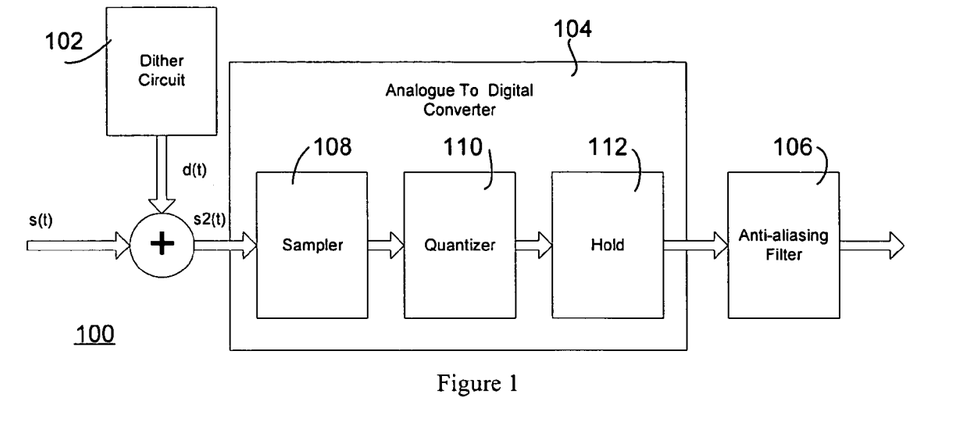
FIG. 1 is a block diagram of an analog to digital converter with an analog dither circuit external to the converter.

Referring to FIG. 1, a block diagram of an Analog-to-Digital Converter (ADC) in accordance with an embodiment of the present invention is illustrated generally by numeral 100. The ADC 100 includes a dither circuit 102, a standard "off-the-shelf" ADC 104, and an anti-aliasing filter 106. The standard ADC 104 includes a sampler 108, a quantizer 110, and a hold circuit 112.

In an embodiment, the dither circuit 102 generates an analog dither signal d(t), which is added to a band-limited input signal s(t). The resulting combined signal s2($t$) is sampled by the sampler 108 at a rate of T times per second. The quantizer 110 quantizes the resulting sampled signal into one of several possible discrete levels. The hold circuit 112 holds the resulting quantized sample for the duration of the sampling time. Output from the hold circuit 112 is input to the anti-aliasing filter 106, which produces an estimate of the original signal s(t).

Figure 2:
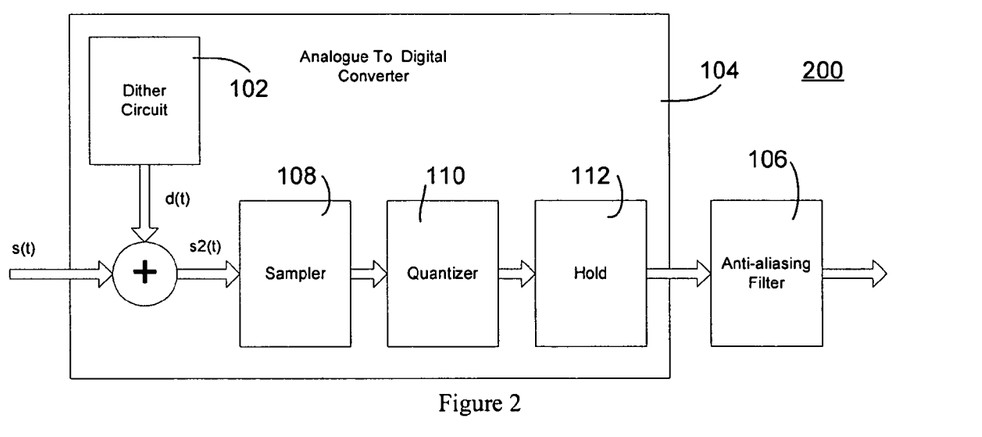
FIG. 2 is a block diagram of an analog to digital converter with an analog dither circuit internal to the converter.
Figure 4:
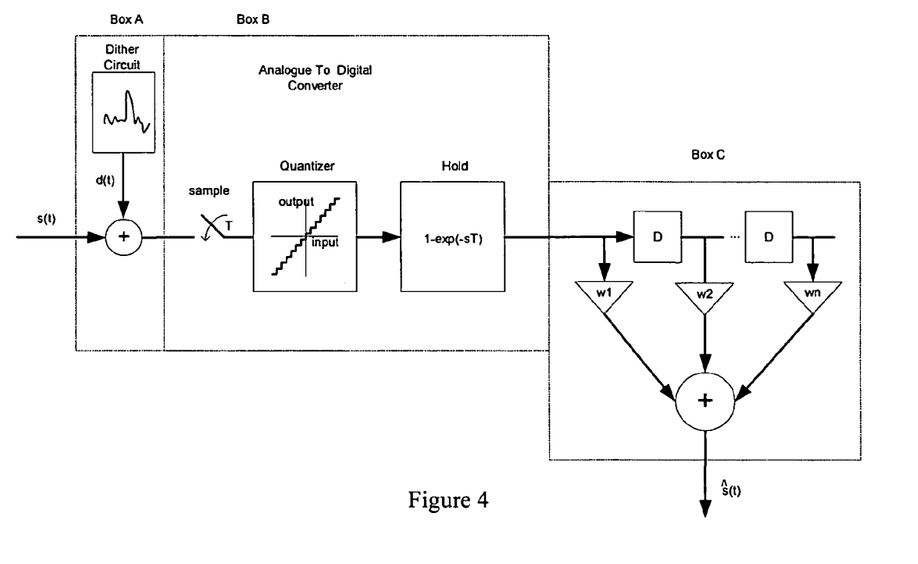
FIG. 4 is a schematic diagram of the analog to digital converters shown in FIGS. 1 and 2.

Referring to FIG. 2, an alternate embodiment of the ADC is illustrated generally by numeral 200. In the present embodiment, the dither circuit 102 is included as part of the standard ADC 104. Referring to FIG. 4, a more detailed drawing of the embodiments illustrated in FIGS. 1 and 2 is shown.

Figure 3:
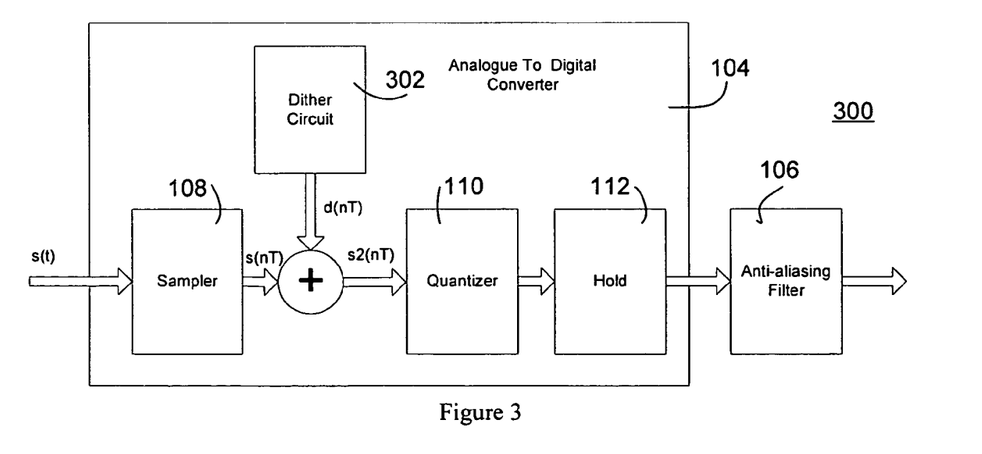
FIG. 3 is a block diagram of an analog to digital converter with a digital dither circuit internal to the converter.
Figure 5:
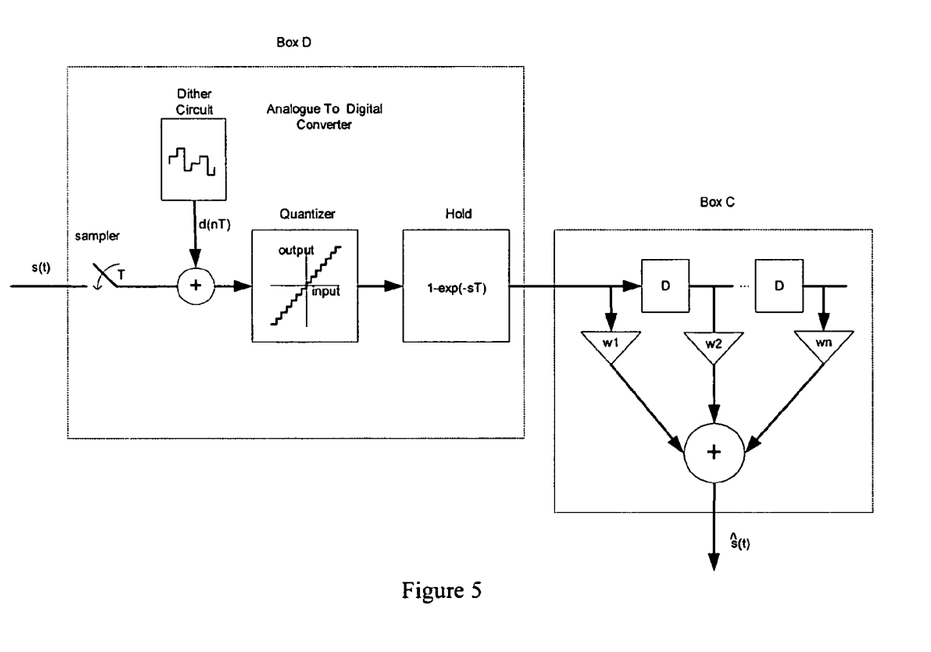
FIG. 5 is a schematic diagram of the analog to digital converter shown in FIG. 3.

Referring to FIG. 3, yet an alternate embodiment of the ADC is illustrated generally by numeral 300. In the present embodiment, a dither circuit 302 is included as part of the standard ADC 104. However, the dither circuit generates a digital dither signal d(nT). Accordingly, the dither signal d(nT) is added to an output s(nT) of the sampler 108, which is a digital representation of the input signal s(t). Referring to FIG. 5, a more detailed drawing of the embodiment illustrated in FIG. 3 is shown.

For all of the above embodiments, the input signal s(t) is assumed to be band-limited so that the maximum frequency of s(t) is F. Thus, the sampler runs at a rate of at least 2F so that the input signal s(t) can be reconstructed, without error, from its samples. In a typical operational mode, the sampler 108 produces samples at a rate equal to 2KF, where K is greater than unity. Examples of useful values for K include K=4, 8, 16 and 32, although other values may be used as will be appreciated by a person skilled in the art. Using values greater than unity for K results in an over-sampling of the signal s(t). Over-sampling has several important advantages including improving the accuracy of estimating the input signal s(t), the details of which will be discussed later in the description.

Many standard ADCs 104 have eight bits of resolution. However, many of today's applications require greater resolution. For example, in order to build a studio-quality video decoder, at least ten bits of resolution are required for the ADC. Thus, the previously described embodiments provide the ability to run a low resolution eight bit standard ADC at a much higher sampling rate by introducing the dither circuit 102 and the anti-aliasing filter 106. In effect, these embodiments may achieve the same or better resolution as a higher resolution ADC would have provided, but at a lower cost.

In the standard ADC 104, the achievable resolution is limited to the resolution of the Least Significant Bit (LSB). The LSB is directly related to the step-size of the quantizer characteristic. That is, fewer quantization levels yield a lower resolution. Typically, in the prior art, a ten-bit resolution ADC required ten quantization levels. In accordance with the present embodiment, the addition of the dither circuit 102 and the anti-aliasing filter 106 provides the ability to achieve resolution of at least ten bits using an eight-bit standard ADC 104. The dither signal acts on a quantization characteristic of the quantizer 110 in such a way that a quantization error is averaged out by the anti-aliasing filter 106.

Figure 6:
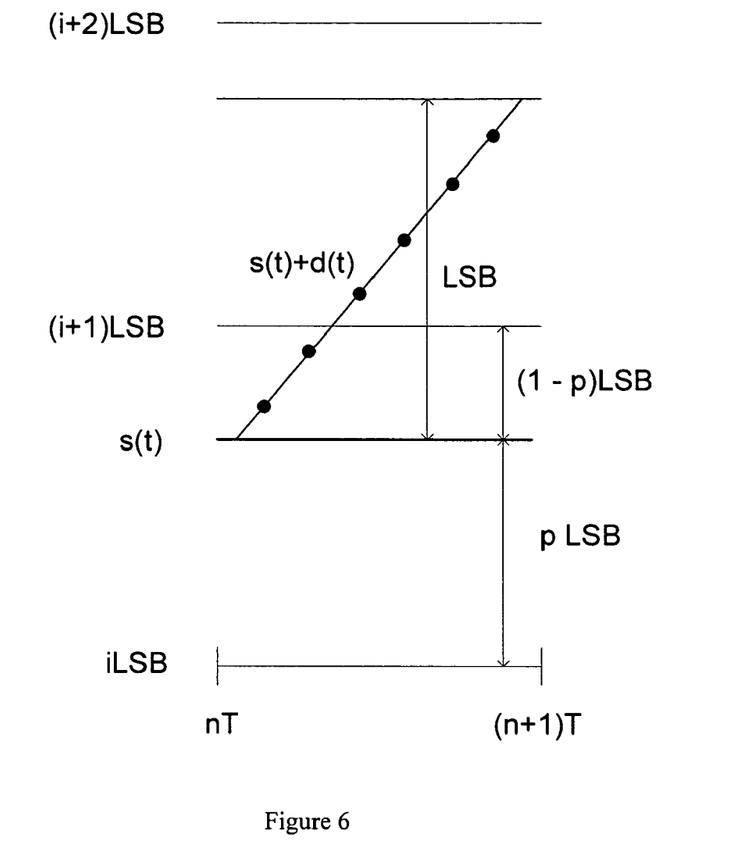

Referring to FIG. 6, a drawing illustrating the quantization characteristic is shown. In the drawings, first, second, and third quantization levels are represented as iLSB, (i+1)LSB, and (i+2)LSB, respectively. Thus, it can be seen that the distance between two levels can be represented as LSB. A sample input signal s(t) falls between the first level iLSB and the second level (i+1)LSB. Only one sampling period T of the input signal s(t) is shown, from nT to (n+1)T. The distance between the input signal s(t) and the first level iLSB is represented as pLSB, where p is a fraction. Therefore, the distance between the input signal s(t) and the second level (i+1)LSB is (1−p)LSB.

Figure 7:
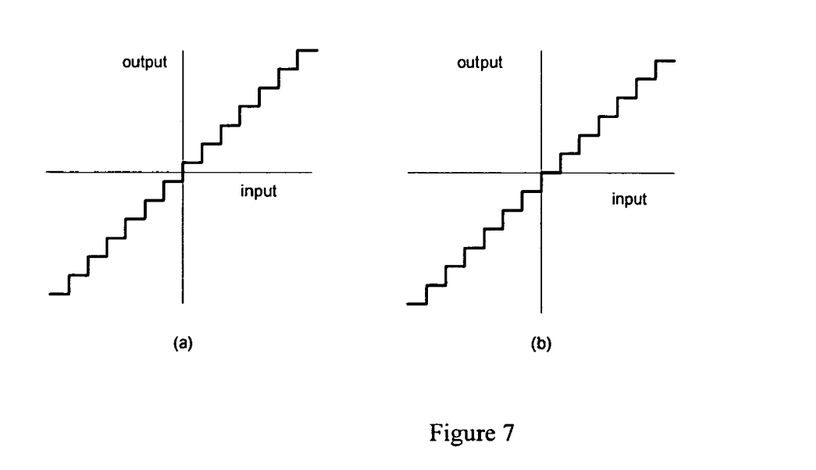
FIG. 7A is a graph illustrating quantization characteristics for rounding a sampler.
FIG. 7B is a graph illustrating quantization characteristics for truncating a sampler.

In the present example, the quantizer 110 is implemented with a truncation characteristic, as illustrated in FIG. 7b. That is, each sample of the input signal s(t) is truncated to an adjacent lower level. Thus, applying the prior art to the present example, each sample of the input signal s(t) during the sampling period would result in an output of iLSB. However, in the present embodiment, a dither signal d(t) is added to input signal s(t). Since truncation is used, it is preferable that the dither signal d(t) be an evenly distributed signal in the interval [0,1) LSB.

Assume, for ease of explanation, that the dither signal d(t) is a ramp. Accordingly, the combined input and dither signal s2(t) is a ramp between s(t) and s(t)+LSB. Also, assume that the combined input and dither signal s2(t) is oversampled such that it is sampled six times during the sample period T. As can be seen from the drawing, two of the samples lie between s(t) and (i+1)LSB and four of the samples lie between (i+1)LSB and s(t)+LSB. Thus, when the combined sampled signal s2(nT) is quantized, it is quantized as two samples at (i)LSB and four samples at (i+1)LSB.

Once the duration of the sample period T is complete, the quantized signal is output to the anti-aliasing filter. In the present embodiment, the anti-aliasing filter is implemented as a finite impulse response (FIR) filter. The FIR filter is implemented using a tapped delay line where the quantized signal passes through a series of delay elements D, as illustrated in FIGS. 4 and 5. Each delayed version of the sampled signal is subsequently multiplied by an associated weighting factor w(0) to w(N) and then summed together, providing an average. An output signal ŝ(t) from the anti-aliasing filter 106 is an estimate of the input signal s(t). The output signal ŝ(t) has a greater resolution than that capable of being provided by the standard ADC 104. In the example illustrated in FIG. 6, the output signal ŝ(t) is ⅔(i+1)LSB.

The following paragraphs provide a mathematical analysis of the above-described example. The ensuing analysis assumes an ideal sampler with truncation, but the results apply equally well to a quantizer that has a rounding characteristic, as illustrated in FIG. 7a. It should be noted that if rounding is performed instead of truncation, it is preferable that the dither signal d(t) be an evenly distributed signal in the interval [−0.5,0.5)LSB.

The input signal s(t) is assumed to be a properly normalized, continuous-time signal that is to be sampled using a Q-bit ADC. Therefore, the ADC has $M=2^Q$ levels, and each level is of height ½Q. For the purpose of the present analysis, it has been assumed that the quantization levels are uniformly distributed. In general, this is not necessary but it complicates the analysis unnecessarily. The worst-case error is limited to LSB if we assume truncation between quantization levels, and LSB/2 if we assume rounding between quantization levels.

As has been described, the precision of the estimate, in an average sense, can be improved by perturbing the input signal s(t) by the dither signal d(t). It is desirable to determine the properties of d(t) that, when added s(t), will improve the precision of the estimate. In general, the coefficients w(1) to w(N) may differ from one another, but for the ensuing analysis and for simplicity, the weights are assumed to be equal. Further, for simplicity, the analysis assumes that the input signal s(t) is constant. While this is typically not true, if the over-sampling factor K becomes large enough, the approximation become more accurate due to the band-limited nature of the signal s(t).

Then the dithered, sampled and quantized signal is represented as:

$$s^*(jTs) = \text{Quantize } (s(t)+d(t)|t=jTs.  \quad \text{Equation 1}$$

The anti-aliasing filter produces a signal equal to:

$$s\sim(jT) = 1/N(w(1)*s*(j-m)T) + \ldots + w(N)s*((j-m-N)T). \quad \text{Equation 2}$$

It is important that the estimate s~ be as accurate as possible and be unbiased. One way to achieve this is to require that the dither signal d(t) is uniformly distributed between [0, LSB).

The statistical behavior of s~ is determined as follows. Referring once again to FIG. 6, s(t) resides between one level iLSB and an adjacent level (i+1)LSB for i=0, ..., ($2^Q-1$). Further input signal s(t) is assumed to be constant and equal to, without loss of generality, iLSB+pLSB, where $0 \leq p < 1$. Thus, the problem reduces to the ability to estimate p, because there is no error associated with iLSB.

The dither signal d(t) is added to the input signal s(t) such that there are N2 instances where the combined signal s(t)+d(t) occurs in the interval [(i+1)LSB, s(t)+LSB), and N1 instances where the combined signal s(t)+d(t) occurs in the interval [s(t), (i+1)LSB), after sampling and quantization. Thus, the estimate ŝ(t) is given by:

$$\hat{s}(t) = [(iN1 + (i+1)N2)/(N1+N2)]LSB \quad \text{Equation 3}$$
$$= iLSB + [N2/(N1+N2)]LSB$$

The quantity N2/(N1+N2) is less than unity, so the right-hand term in Equation 3 represents a fraction of the least significant bit. The normalized error $\zeta(t)$ in the estimate is given by:

$$\zeta(t) = (s(t) - \hat{s}(t))/LSB \quad \text{Equation 4}$$
$$= ((iLSB + pLSB) - (iLSB + [N2/(N1+N2)]LSB))/LSB$$
$$= p - N2/(N1+N2).$$

Therefore, if N1 and N2 occur in the correct proportion, then they will exactly reflect the level of the input signal s(t) relative to the bounding quantization levels. This is the motivation behind the imposition of the uniformity of the distribution of the dither signal d(t), which is the preferred implementation.

Further, Equation 4 implicitly assumes that an average is taking place. If the input signal s(t) is constant, the greater the number of meaningful samples in the average, and the more accurate the result. This is true provided the samples generated to form ŝ(t) are unbiased. The error is due directly to the rational approximation of the ratio N2/(N1+N2) to the value p.

The intrinsic variance of the estimation of a constant is:

$$\sigma^2 = (((i+1)LSB - (i+1)LSB(1-p) - iLSBp)2(1-p) + (iLSB - (i+1)LSB(1-p) - iLSBp2)p)/(N-1). \quad \text{Equation 5}$$

Therefore, the standard deviation is:

$$\sigma = LSB\sqrt{p(1-p)/(N-1)}. \quad \text{Equation 6}$$

The variance in the estimate decreases as N increases. Therefore, the greater the number of samples generated, the more accurate the estimate. This fact agrees with the Law of Large Numbers. It is also intuitively satisfying that the variance is independent of the magnitude of the input signal s(t). Moreover, the variance drops to 0 where p is either 0 or 1. This is correct as the estimate is exact where the input signal level coincides with one of the quantization levels. This statistical result is only valid for random samples that are independent. Equation 6 does not apply for non-independent samples such as those drawn from a stratified distribution.

Uniform noise is preferred as the dither signal d(t), because the variance is reduced most quickly with oversampling and averaging. Other noise distributions, while not optimal, can provide a benefit. One of the possible conditions for the dither signal d(t) is that the ADC noise be symmetric with respect to the signal amplitude, the estimate will be unbiased—if the ADC rounds the result to the nearest quantization level. That is, the average impact of the noise may be zero, otherwise it will increase/decrease value obtained after filtering.

The variance of the estimate is a function of the noise statistics. Several noise estimation experiments using existing ADCs show that the noise is not uniform, but approximates a Normal whose mean is the signal level, and whose variance is approximately LSB/100. In this case, the sum of normal deviates is still normal. Specifically, for a constant signal level, the distribution that results due to the sum of N Independent and Identically Distributed (IID) normal deviates is unchanged. However, the variance of the average of these deviates decreases with the number of samples. It is likely that the noise process is not Normal, it is normal-like, or more similar to a truncated normal distribution. It is not Normal due to the physical impossibility of observing deviates from the tails of the normal distribution. Then the variance in the estimate will decrease with N samples when averaged.

There are a number of ways to generate an unbiased estimate for the discrete implementation shown in FIG. 5. This depends on how the uniformly distributed dither signal d(t) is generated. Some of the more useful types of candidate generators include sequential uniform distribution (for example a ramp or a Gray-code), pseudo-random uniform distribution (for example a Lehmer type generator), a linear field shift register (for example Galois field modulo 2 type generator), and quasi-random generation or stratified sampling (for example Faure, Sobol, and Halton).

If each of the possible values of d(t) is considered a state, then using each state in the estimate will result in an unbiased estimate for constant s(t). A linear shift register, despite being an excellent generator of random bits, is a poor generator of random numbers. This is due to the significant correlation between neighbouring samples. For this reason, it is preferable that method not be used to generate the dither signal d(t).

Using a generator such as a ramp achieves this sequentially. As long as the input signal s(t) is constant during the ramp's cycle, each state is visited and the estimate will be unbiased. As with all dither signals d(t), there is a risk that the input signal s(t) will not remain constant and a bias, a so-called short-term incremental bias, can be introduced. While the ramp does eventually generate a uniform distribution by visiting the states sequentially, it incurs a potentially large bias build-up until the ramp is complete. The bandwidth of a ramp is also lower and, thus, has a greater chance of being correlated with a band-limited input signal s(t).

Equation 4 imposes no constraint on the order in which the states are frequented. If the states are visited in "random" order, the incremental estimate has less bias, in general. Accordingly, stratified sampling can have an advantage over more traditional methods of random number generation, as discussed in Niederreiter, Harald, "Random number generation and quasi-Monte Carlo methods", Philadelphia, Pa., Society for Industrial and Applied Mathematics, 1992.

Refining the accuracy of the estimate is possible by varying N dynamically, provided successive samples d(t) visit new states. When using a sequential generator this is not possible without introducing a bias. This is another reason that motivates the use of stratified sampling. The following describes how the estimate might be refined.

Suppose, for example, that the four-cycle set of numbers, (0, ¾, ¼, ½)LSB is generated as the dither signal d(t) and the input signal s(t) comprises only a DC component. Simply repeating the same four numbers does not achieve additional accuracy in the estimate signal ŝ(t). Thus, another set of meaningful, stratified numbers is chosen that fills in the gaps in the previous set. Adding one half of the interval to the set, which yields (0+⅛, ¾+⅛, ¼+⅛, ½+⅛)LSB is one way to do this. This decreases the error by one half. Sampling in this manner also avoids building in a large incremental bias in the estimate. Further, it helps to reduce the probability of correlation.

Typically, stratified samples do not lead to correlations between the dither signal d(t) and the input signal s(t). Since, the exact nature of the input signal s(t) in unknown, choosing a dither signal d(t), no matter how "random" may lead to a correlation. However, since the input signal s(t) is band-limited, it is unable to track fast variations in the dither signal d(t). Thus, generally speaking, if a dither signal d(t) is chosen that has a spectrum sufficiently different from the input signal s(t), correlations there between are less likely. If there are q states and in the stratified uniform distribution, and each of the states is visited for constant input signal s(t), then the worst-case error is LSB/q assuming n=q.

Taking an average over a larger number of samples is best when the input signal s(t) is constant, but not necessarily when it is changing. However, the best filter length to use for a varying input signal s(t) might differ. To understand this problem, it is assume that the input signal s(t) is a band-limited signal to fs Hz. Typically, we want the −3 db point of the averaging filter to stay away from the useful bandwidth of the input signal s(t). This implies the filter length should not be arbitrarily long for a non-constant input signal s(t), because the bandwidth of the averaging filter decreases with increasing filter length.

The input signal s(t) is not decimated, so there is no danger of violating the Whittaker sampling bound (which later became known as the Nyquist limit or Shannon's sampling bound). That is, aliasing is not the culprit. The culprit is attenuating the higher frequencies and the phase delay of the input signal s(t) should the averaging filter become too long relative to the period of the signal. Using a center tap design if a data delay can be tolerated can mitigate the latter.

The magnitude of the frequency response of an averaging filter is:

$$H(ej\omega)|=1/N|\sin(N\omega T/2)/\sin(\omega T/2)|.$$  Equation 7

Suppose the input signal s(t) is a pure harmonic at the band-limited frequency of $\omega s$ and $\gamma$, $0<\gamma\leq 1$ is the maximum allowable attenuation factor of s(t) at $\omega s$. Then the number of taps n* can be determined from the solution to the constraint:

$$n^*=\max n:\{|\sin(N(\omega s\ T/2)|-\gamma N\ |\sin(\omega s\ T/2)|>=0\}.$$  Equation 8

Depending on the bandwidth of the signal $\omega s$, the sampling period T, the length of the filter n can be altered dynamically to satisfy Equation 7. Some logical control circuitry is needed to do this properly. One simple control strategy is to monitor the input signal s(t). As it begins to deviate from a constant, the filter length is reduced. As the input signal s(t) appears to be more constant, the filter length is increased, indefinitely if possible. Further, application of an Infinite Impulse Response (IIR) filter would minimize hardware components in the limit.

A person of reasonable skill in the art should recognize that as the variance of the input signal s(t)—or perhaps the signal s(t) after the minimum amount of filtering—becomes small, the filters treats the signal s(t) and/or manipulates variance as noise. Likewise, as the variance of the signal s(t) increases, the system treats and/or manipulates the signal variance as a signal itself.

In an embodiment, the filter operates as follows. The filter filters the variance of the input signal s(t) with a predetermined function. The filter maps the output to a probability that the signal is noise (e.g., 1 being all noise, 0 being all signal). The filter includes a first filter for the case where the variance indicates noise and a second filter for the case where the variance indicates a signal. The filters blends the first and second filters based on the probability that the signal s(t) is noise.

Figure 9:
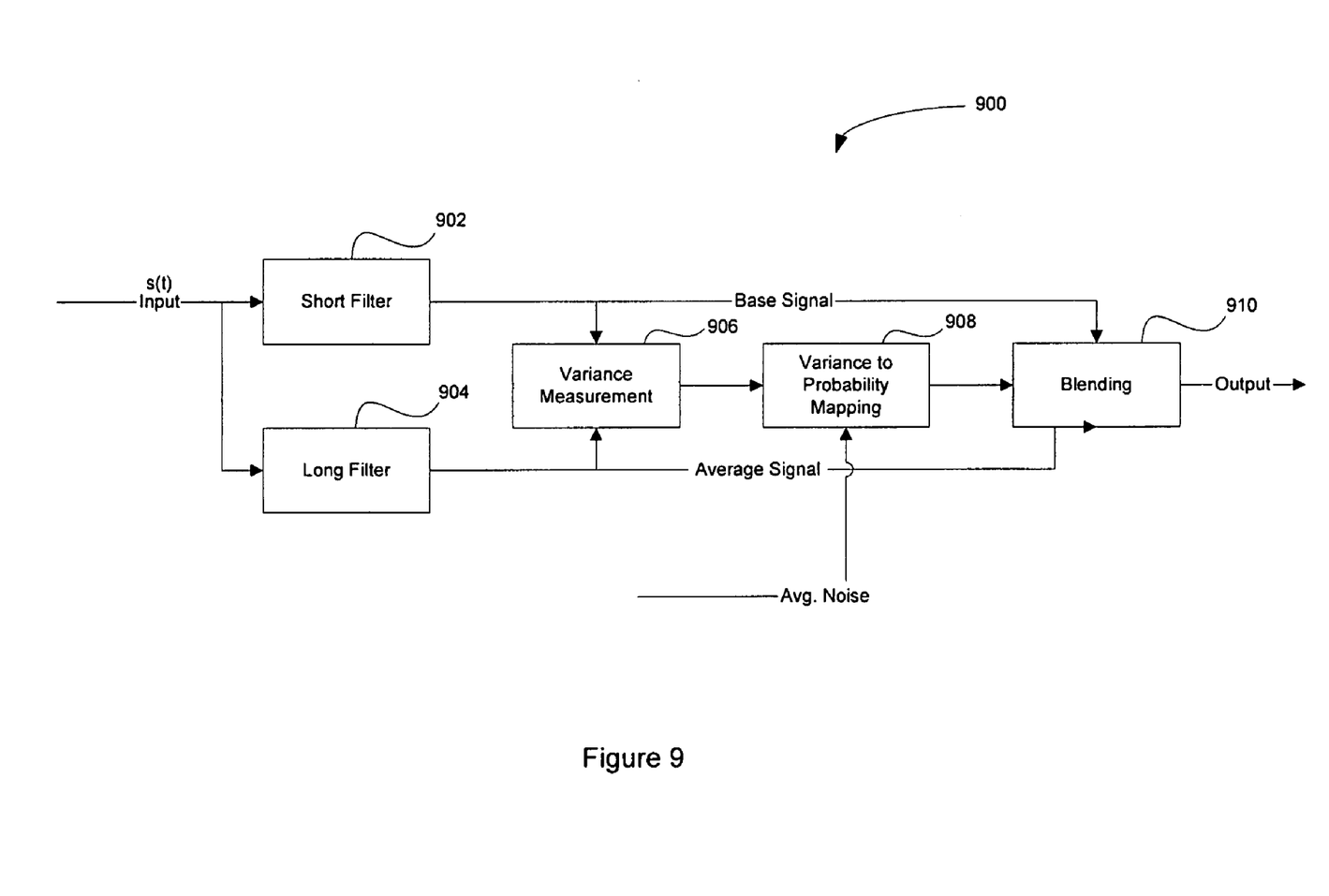
FIG. 9 is a block diagram of an embodiment of a filter 900 for the input signal s(t).

FIG. 9 is a block diagram of an embodiment of a filter 900 for the input signal s(t). The filter 900 includes short length or base filter 902 and a long length or average filter 904. A variance block 906 compares the time variations between the filtered signals output from the short filter 902 and a predetermined value that represents the average noise of the base signal. In an embodiment, the variance block 906 compares the time variations between the filtered signals output from the short and long filters 902 and 904, respectively. The mapping block 908 maps the variance measured at 906 to a probability that the signal is either noise or signal responsive to an average noise signal. If the probability that the variance observed is noise equals one, the block 908 sets its output equal to the average signal. If the probability that the variance observed is zero, the block 908 sets its output to the base signal output from short filter 902. If the probability is other than one or zero, the block 908 sets its output to some intermediate value between the base and average signals output form the filters 902 and 904, respectively. The output of the mapping block 908 is blended at 910 with the base signal output from the short filter 902.

A noise estimation block 902 estimates noise in the input signal s(t). The noise estimation block 902 estimates noise using well-known statistical processing algorithms. In an embodiment, the noise estimation block 902 estimates noise using a known area of the input signal s(t) where there is no signal (e.g., during the so-called back porch). In an embodiment, the noise estimation block 902 estimates noise by taking a minimum value of the noise measured in small sections of each line of the input signal s(t). A person of reasonable skill in the art should recognize other methods of estimating noise in the input signal s(t).

The filter 900 includes at least two additional filters, a large filter 903 and a small filter 904. The large filter 903 more aggressively reduces noise at the expense of the frequency response. The smaller filter 904 preserves the frequency response at the expense of more noise. A person of skill in the art would recognize the design of the large and small filters 903 and 904. The large and small filters 903 and 904 will not be discussed in any further detail.

An optional filter 905 filters the ratio of the output from the averaging block 901 and the noise estimation block 902. The optional filter 905 reduces the impact of the impulse noise and prevents modulation of the ratio with itself. In an embodiment, the ratio of the output from the averaging block 901 and the noise estimation block 902 may be replaced with a piecewise linear prescale (e.g., 4:1 multiplexer) and a multiplier. A mapping block 906 maps the input differences into a probability that the output of the averaging block 901 is noise (as contrasted with a feature of the image). A person of skill in the art would recognize the design of the optional filter 905 and the mapping block 906. The optional filter 905 and the mapping block 906 will not be discussed in any further detail.

It is not difficult to choose an input signal s(t) in which one dither strategy is better than another. The ramp, for example, is better when the input signal s(t) is closer to iLSB and the stratified approach is better when the input signal s(t) is nearer to (i+½)LSB, as far as an incremental bias is concerned. In one dimension, the benefit of stratified sampling is not as apparent as it is in higher dimensions. Therefore, the ramp, for short cycle lengths, can do a reasonable job, but still not as good, in general, as a pseudo-random number sequence or stratified samples. Interestingly, the instantaneous error due to dithering can be made larger, but the average error is made smaller.

As the low frequency content of the input signal s(t) decreases, the benefits offered by dithering can decrease. It is easy to fabricate an input signal s(t), or conversely a dither signal d(t), in which dithering the input results in an estimate that is less accurate than had no dithering been used at all.

As previously mentioned, often during ADC conversion the sampled signal includes unwanted, additive, periodic perturbations that have a corruptive influence on the integrity of the sampled values. In particular, it is not uncommon for there to be a corruptive signal related to the sample clock frequency. This signal is due directly to the mechanism responsible for sampling the signal. This occurs, for example, in a poorly designed ADC, where pulses that form the sampling clock bleed through the ADC electronics to such an extent that they perturb the original signal itself. Other signals that should be minimized because they disturb the input signal. For the case of a video input signal, the signals to be minimized include a third harmonic of the NTSC and PAL colour sub-carriers at 10.6 MHz and 13.2 MHz, respectively, and an MPEG reconstruction clock at 13.5 MHZ. It is desirable to attenuate their negative influence on the visual quality of video input signals.

These signals can be either removed or marginalized by crafting a frequency response of the anti-aliasing filter in a predetermined manner. In particular, the frequency response of the anti-aliasing filter is designed to have a notch at, or near, each frequency that is to be attenuated. The design of a FIR filter to have notches at predetermined frequencies is known in the art and need not be described in detail Referring for FIGS. 8*a* and 8*b*, the magnitude and phase of the frequency response for the anti-aliasing filter 106 is shown generally by numerals 800 and 850 respectively. As can be seen from the magnitude of the frequency response 800, there is notches 802*a–d*, also referred to as spectral dips or nulls, which attenuate the signal. A first notch 802*a* in the frequency response is located between the normalized frequency of 0.2 radians/sec and 0.3 radians/sec. In non-normalized frequency axis, this location corresponds to a frequency of 13.5 MHz, which is the frequency of the MPEG reconstruction clock. Thus, it can be seen that the first notch 802*a* attenuates the affects of the MPEG reconstruction clock. Further, the notches are repetitive. That is, the frequency response exhibits notches at 13.5 n MHz, n=1,2,3 and 4 for first 802*a*, second 802*b*, third 802*c*, and fourth 802*d* notches, respectively.

Figure 8A:
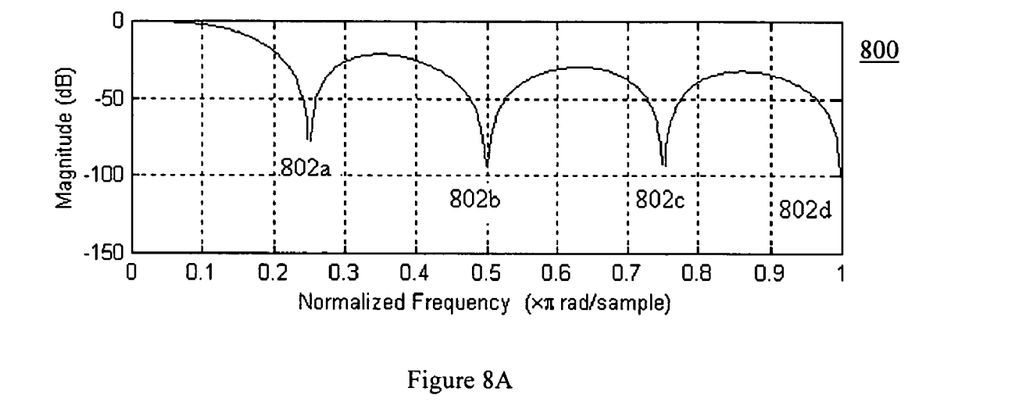
FIG. 8A is a graph illustrating the magnitude of the frequency response of an anti-aliasing filter used in the analog to digital converter.
Figure 8B:
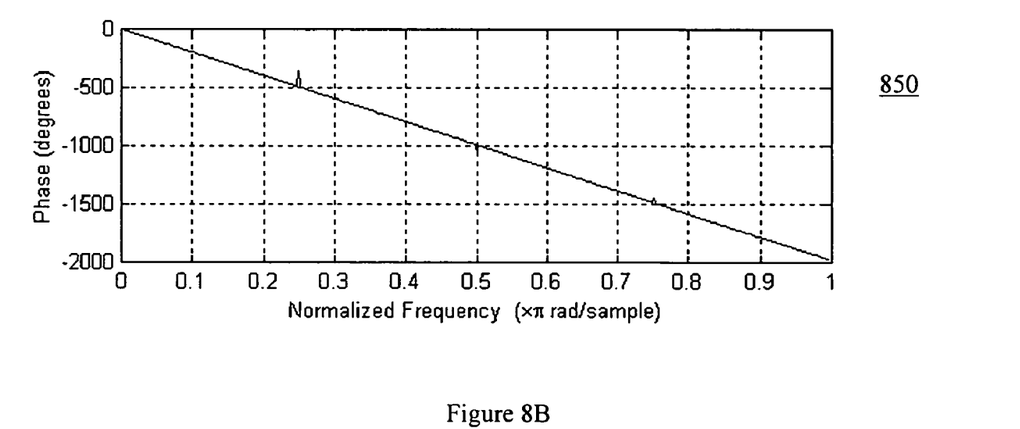
FIG. 8B is a graph illustrating the phase of the frequency response of an anti-aliasing filter used in the analog to digital converter.

The fourth notch 802, at approximately 1 radian/sec, corresponds to a frequency of 54 MHz. Thus, if the sampling clock is selected to operate at 108 MHz, the fourth notch 802*d* is coincident with the ADC sampling clock noise at 54 MHz, which is the Nyquist rate for a sampling clock running at 108 MHz. Further, the notches 802*a–d* represent sub-harmonics of the ADC sampling clock frequency. As a result, the anti-aliasing filter 106 is programmed to attenuate unwanted signals in addition to improving the resolution of the ADC.

Therefore, it is preferable to select the frequency of the sampling clock in accordance with an auxiliary frequency that is to be attenuated. This is achieved by designing the anti-aliasing filter 106 to have a plurality of spectral notches corresponding to the auxiliary frequency and multiples thereof. The notch coinciding with the auxiliary frequency attenuates its magnitude. Further, the sample clock frequency of the ADC is selected such that one of its sub-harmonics coincides with the auxiliary frequencies. That is, the sample clock frequency is a multiple of auxiliary frequency. In the present embodiment, a sub-harmonic is any frequency f1 that is smaller than a higher frequency f2 such that the ratio f2/f1 has no remainder.

If it is desirable to attenuate other unwanted auxiliary frequencies, the sampling clock frequency should be chosen to eliminate them as well. More precisely, let F(i) be the principal auxiliary frequency component to be attenuated. Let Fs be the sampling clock frequency of the ADC. Then, Fs/F(i)=n(i), where n(i) is a positive integer. Fs is chosen as the least common denominator of the set {1/n(i)}.

If you want to simplify the filter, then the sampling clock should be an integer multiple of the unwanted frequencies. In general any sampling frequency can be used as long as the sampling frequency is an integer multiple of the unwanted frequency, e.g., 2×, the frequency to be eliminated or the alias of that frequency is outside the pass band of the filter. For example, if the input frequency is to be eliminated is $\frac{2}{3}^{rd}$'s the sample rate, then the alias frequency will be $\frac{1}{3}^{rd}$ the sample rate and can be filtered out if it lies outside the signal pass band. The idea here and as shown in the figure is that the "noise" is not necessarily uniform, but has spikes. So if you place the notches at the spikes, then you can get away with less attenuation at the other frequencies than is normally required. Practically, this would lead to a clock frequency of excessive sampling rate. Fortunately, there are usually only the first or second smallest F(i) and harmonics need to be attenuated. The main purpose is not to eliminate a strong signal at n*F(i), but rather low signal periodic noise.

Although the invention has been described with reference to certain specific embodiments, various modifications thereof will be apparent to those skilled in the art without departing from the spirit and scope of the invention as outlined in the claims appended hereto.

The invention claimed is:

1. A circuit for improving performance of an analog-to-digital converter (ADC), comprising:
   a dither circuit to generate a dither signal to be added to an analog input signal;
   an ADC to convert the input signal;
   a filter to average a digital signal representative of a combination of the dither and the input signals and to oversample the digital signal representative of the combination of the dither and input signals;
   where the filter includes a notch at a color sub-carrier rate of a television communication standard and wherein the filter comprises a control circuit to dynamically adapt a size of a tapped delay line in accordance with the input signal.

2. The circuit of claim 1 where the dither signal is an analog signal and is added to the input signal before being sampled by the ADC.

3. The circuit of claim 1 where the dither signal is a digital signal and is added to the input signal after the input signal is sampled by the ADC.

4. The circuit of claim 1 where a sampling clock of the ADC has a frequency that is at least twice as high as a maximum frequency of the input signal.

5. The circuit of claim 1 where a sampling clock of the ADC has a frequency that is eight, sixteen, thirty-two, or sixty-four times as high as a maximum frequency of the input signal.

6. The circuit of claim 1 where the dither signal comprises uniform noise.

7. The circuit of claim 6 where the uniform noise comprises pseudo-random samples.

8. The circuit of claim 6 where the uniform noise comprises gray-code samples.

9. The circuit of claim 6 where the uniform noise comprises stratified samples.

10. The circuit of claim 6 where the uniform noise comprises sequential samples.

11. The circuit of claim 1 where a frequency response of the filter is designed to have a notch coinciding with an unwanted perturbation in the input signal to thereby attenuate the perturbation.

12. The circuit of claim 1 where the filter is an anti-aliasing filter.

13. The circuit of claim 12 where the anti-aliasing filter comprises a Finite Impulse Response (FIR) filter.

14. A circuit for improving performance of an analog-to-digital converter (ADC), comprising:
  a dither circuit to generate a dither signal to be added to an analog input signal;
  an ADC to convert the input signal; and
  a filter to average a digital signal representative of a combination of the dither and the input signals, to provide an improved estimate of the input signal wherein the filter comprises a control circuit to dynamically adapt a size of a tapped delay line in accordance with the input signal;
  where a frequency response of the filter is designed to have a notch coinciding with an unwanted perturbation in the input signal to thereby attenuate the perturbation; and
  where a clock frequency of the ADC is selected as a harmonic or sub-harmonic of the unwanted perturbation.

15. The circuit of claim 14 where the frequency response of the filter includes a plurality of notches occurring periodically such that the notches coincide with both of the clock frequency and the unwanted perturbation.

16. A circuit for improving performance of an analog-to-digital converter (ADC), comprising:
  a dither circuit to generate a dither signal to be added to an analog input signal;
  an ADC to convert the input signal; and
  a filter to average a digital signal representative of a combination of the dither and the input signals, to provide an improved estimate of the input signal;
  where the filter is an anti-aliasing Finite Impulse Response (FIR) filter including:
    a tapped delay line;
    a plurality of weighting factors to average the combination of input and dither signals and wherein the filter comprises a control circuit to dynamically adapt a size of a tapped delay line in accordance with the input signal.

17. The circuit of claim 16
  where the size of the tapped delay line decreases as the input signal strays from a constant value; and
  where size of the tapped delay line increases as the input signal approaches a constant value.

18. A circuit for improving performance of an analog-to-digital converter (ADC), comprising:
  a dither circuit to generate a dither signal to be added to an analog input signal;
  an ADC to convert the input signal; and
  a filter to average a digital signal representative of a combination of the dither and the input signals, to provide an improved estimate of the input signal;
  where the filter is an anti-aliasing Infinite Impulse Response (IIR) filter and wherein the filter comprises a control circuit to dynamically adapt a size of a tapped delay line in accordance with the input signal.

19. A circuit comprising:
  a dither circuit to generate a dither signal to combine with an input signal;
  an analog to digital converter coupled with the dither circuit, to digitize the combined input and dither signals; and
  a filter coupled with the analog to digital converter, to filter the digitized combined input and dither signals;
  where the analog to digital converter is adapted to increases in resolution responsive to the dither signal;
  where the filter is adapted to oversample the digitized combined input and dither signals;
  where the filter includes a notch at a color sub-carrier rate of a television communication standard and wherein the filter comprises a control circuit to dynamically adapt a size of a tapped delay line in accordance with the input signal.

20. The circuit of claim 19 where the filter is a finite impulse response filter.

21. The circuit of claim 19 where the filter is an infinite impulse response filter.

22. The circuit of claim 19 where the dither circuit is integral to the analog to digital converter.

23. The circuit of claim 19 where the dither circuit generates a discrete dither signal.

24. The circuit of claim 19 where the filter is configured with a notch at a sample clock frequency of the analog to digital converter.

25. A circuit comprising:
  a dither circuit to generate a dither signal to combine with an input signal;
  an analog to digital converter coupled with the dither circuit, to digitize the combined input and dither signals; and
  a filter coupled with the analog to digital converter, to filter the digitized signal;
  where the analog to digital converter increases in resolution responsive to the dither signal;
  where the filter is configured with a notch at a sample clock frequency of the analog to digital converter;
  where the filter is configured with additional notches at sub harmonics of the sample clock frequency and wherein the filter comprises a control circuit to dynamically adapt a size of a tapped delay line in accordance with the input signal.

26. A circuit comprising:
a dither circuit to generate a dither signal to combine with an input signal;
an analog to digital converter coupled with the dither circuit, to digitize the combined input and dither signals; and
a filter coupled with the analog to digital converter, to filter the digitized signal;
where the analog to digital converter increases in resolution responsive to the dither signal;
wherein the filter is configured with a notch at the MPEG reconstruction clock and wherein the filter comprises a control circuit to dynamically adapt a size of a tapped delay line in accordance with the input signal.

27. The circuit of claim 26 comprising at least one notch at a harmonic of the MPEG reconstruction clock.

28. A circuit comprising:
a dither circuit to generate a dither signal to combine with an input signal;
an analog to digital converter coupled with the dither circuit, to digitize the combined input and dither signals; and
a filter coupled with the analog to digital converter, to filter the digitized signal;
where the analog to digital converter increases in resolution responsive to the dither signal;
where the filter is configured with a notch at a color sub-carrier rate of television communication standard and wherein the filter comprises a control circuit to dynamically adapt a size of a tapped delay line in accordance with the input signal.

29. The circuit of claim 28 where the filter includes at least one notch at a harmonic of the color sub-carrier rate.

30. A circuit comprising:
a dither circuit to generate a dither signal to combine with an input signal;
an analog to digital converter coupled with the dither circuit, to digitize the combined input and dither signals; and
a filter coupled with the analog to digital converter, to filter the digitized signal;
where the analog to digital converter increases in resolution responsive to the dither signal; and
where the filter is configured with a notch at a color sub-carrier rate of a television communication standard wherein the filter comprises a control circuit to dynamically adapt a size of a tapped delay line in accordance with the input signal; and
where the television communication standard is NTSC, PAL, or SECAM.

31. A method comprising:
combining a signal with a dithered signal to create a combined signal;
digitizing the combined signal with an analog to digital converter;
filtering the digitized result of the analog to digital converter with an anti-aliasing filter wherein the filter comprises a control circuit to dynamically adapt a size of a tapped delay line in accordance with the input signal; and
over sampling the combined signal to increase the resolution of the analog to digital converter.

32. The method of claim 31 comprising attenuating residual effects from a sample clock frequency of the analog to digital converter.

33. The method of claim 32 comprising configuring the filter with a notch at the sample clock frequency of the analog to digital converter.

34. The method of claim 33 comprising configuring the anti-aliasing filter with additional notches at sub harmonics of the sample clock frequency.

35. A method comprising:
combining a signal with a dithered signal to create a combined signal;
digitizing the combined signal with an analog to digital converter;
filtering the digitized result of the analog to digital converter with an anti-aliasing filter; and
over sampling the combined signal to increase the resolution of the analog to digital converter;
configuring the anti-aliasing filter with a notch at an MPEG reconstruction clock rate wherein the filter comprises a control circuit to dynamically adapt a size of a tapped delay line in accordance with the input signal.

36. A method comprising:
combining a signal with a dithered signal to create a combined signal;
digitizing the combined signal with an analog to digital converter;
filtering the digitized result of the analog to digital converter with an anti-aliasing filter wherein the filter comprises a control circuit to dynamically adapt a size of a tapped delay line in accordance with the input signal; and
over sampling the combined signal to increase the resolution of the analog to digital converter
configuring the anti-aliasing filter with at least one notch at a harmonic of the MPEG reconstruction clock rate.

37. A method comprising:
combining a signal with a dithered signal to create a combined signal;
digitizing the combined signal with an analog to digital converter;
filtering the digitized result of the analog to digital converter with an anti-aliasing filter; and
over sampling the combined signal to increase the resolution of the analog to digital converter;
configuring the anti-aliasing filter with a notch at a color sub-carrier rate of a television communication standard wherein the filter comprises a control circuit to dynamically adapt a size of a tapped delay line in accordance with the input signal.

38. The method of claim 37 where the television communication standard includes NTSC, PAL, or SECAM.

39. The method of claim 37 comprising configuring the anti-aliasing filter with at least one notch at a harmonic of the color sub-carrier rate.

40. An apparatus comprising a computer-readable medium containing computer instructions that, when executed, cause a processor to perform a method comprising:
combining a signal with a dithered signal to create a combined signal;
digitizing the combined signal with an analog to digital converter;
filtering the digitized result of the analog to digital converter with an anti-aliasing filter wherein the filter comprises a control circuit to dynamically adapt a size of a tapped delay line in accordance with the input signal; and over sampling the combined signal to increase the resolution of the analog to digital converter.

41. An apparatus comprising a computer-readable medium containing computer instructions that, when executed, cause a processor to perform a method comprising:
   combining a signal with a dithered signal to create a combined signal;
   digitizing the combined signal with an analog to digital converter;
   filtering the digitized result of the analog to digital converter with an anti-aliasing filter;
   over sampling the combined signal to increase the resolution of the analog to digital converter; and
   configuring the anti-aliasing filter with a notch at a sample clock frequency of the analog to digital converter to thereby attenuate residual effects from the sample clock frequency wherein the filter comprises a control circuit to dynamically adapt a size of a tapped delay line in accordance with the input signal.

42. The apparatus of claim 41 comprising configuring the anti-aliasing filter with additional notches at sub harmonics of the sample clock frequency.

43. An apparatus comprising a computer-readable medium containing computer instructions that, when executed, cause a processor to perform a method comprising:
   combining a signal with a dithered signal to create a combined signal;
   digitizing the combined signal with an analog to digital converter;
   filtering the digitized result of the analog to digital converter with an anti-aliasing filter;
   over sampling the combined signal to increase the resolution of the analog to digital converter; and
   configuring the anti-aliasing filter with a notch at an MPEG reconstruction clock rate wherein the filter comprises a control circuit to dynamically adapt a size of a tapped delay line in accordance with the input signal.

44. An apparatus comprising a computer-readable medium containing computer instructions that, when executed, cause a processor to perform a method comprising:
   combining a signal with a dithered signal to create a combined signal;
   digitizing the combined signal with an analog to digital converter;
   filtering the digitized result of the analog to digital converter with an anti-aliasing filter;
   over sampling the combined signal to increase the resolution of the analog to digital converter; and
   configuring the anti-aliasing filter with at least one notch at a harmonic of an MPEG reconstruction clock rate wherein the filter comprises a control circuit to dynamically adapt a size of a tapped delay line in accordance with the input signal.

45. An apparatus comprising a computer-readable medium containing computer instructions that, when executed, cause a processor to perform a method comprising:
   combining a signal with a dithered signal to create a combined signal;
   digitizing the combined signal with an analog to digital converter;
   filtering the digitized result of the analog to digital converter with an anti-aliasing filter;
   over sampling the combined signal to increase the resolution of the analog to digital converter;
   configuring the anti-aliasing filter with a notch at a color sub-carrier rate of NTSC, PAL, or SECAM wherein the filter comprises a control circuit to dynamically adapt a size of a tapped delay line in accordance with the input signal.

46. An apparatus comprising a computer-readable medium containing computer instructions that, when executed, cause a processor to perform a method comprising:
   combining a signal with a dithered signal to create a combined signal;
   digitizing the combined signal with an analog to digital converter;
   filtering the digitized result of the analog to digital converter with an anti-aliasing filter;
   over sampling the combined signal to increase the resolution of the analog to digital converter;
   configuring the anti-aliasing filter with at least one notch at a harmonic of a color sub-carrier rate of NTSC, PAL, or SECAM wherein the filter comprises a control circuit to dynamically adapt a size of a tapped delay line in accordance with the input signal.

* * * * *